(12) United States Patent
Ide et al.

(10) Patent No.: US 8,847,374 B2
(45) Date of Patent: Sep. 30, 2014

(54) POWER SEMICONDUCTOR MODULE AND MANUFACTURING METHOD THEREOF

(75) Inventors: Eiichi Ide, Hitachi (JP); Shinji Hiramitsu, Kashiwa (JP); Hiroshi Hozoji, Hitachiota (JP); Nobutake Tsuyuno, Naka-gun (JP); Kinya Nakatsu, Hitachinaka (JP); Takeshi Tokuyama, Hitachi (JP); Akira Matsushita, Hitachinaka (JP); Yusuke Takagi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/818,490

(22) PCT Filed: Sep. 5, 2011

(86) PCT No.: PCT/JP2011/070115
§ 371 (c)(1),
(2), (4) Date: Feb. 22, 2013

(87) PCT Pub. No.: WO2012/043149
PCT Pub. Date: Apr. 5, 2012

(65) Prior Publication Data
US 2013/0175678 A1    Jul. 11, 2013

(30) Foreign Application Priority Data

Sep. 30, 2010   (JP) .................. 2010-220252

(51) Int. Cl.
| | | |
|---|---|---|
| *H01L 23/06* | (2006.01) |
| *H01L 21/48* | (2006.01) |
| *H01L 23/495* | (2006.01) |
| *H01L 23/36* | (2006.01) |
| *H01L 23/34* | (2006.01) |
| *H01L 23/00* | (2006.01) |
| *H01L 23/433* | (2006.01) |
| *H01L 23/492* | (2006.01) |
| *H01L 25/18* | (2006.01) |
| *H01L 25/07* | (2006.01) |

(52) U.S. Cl.
CPC ............ *H01L 23/34* (2013.01); *H01L 21/4825* (2013.01); *H01L 23/49524* (2013.01); *H01L 23/49575* (2013.01); *H01L 23/36* (2013.01); *H01L 2924/13091* (2013.01); *H01L 24/33* (2013.01); *H01L 2224/73265* (2013.01); *H01L 2224/4847* (2013.01); *H01L 2924/13055* (2013.01); *H01L 23/4334* (2013.01); *H01L 25/072* (2013.01); *H01L 2224/48472* (2013.01); *H01L 23/492* (2013.01); *H01L 25/18* (2013.01); *H01L 2224/48091* (2013.01)
USPC ............ 257/684; 257/737; 257/775; 257/776

(58) Field of Classification Search
USPC .................... 257/684, 737, 775, 776
See application file for complete search history.

(56) References Cited

U.S. PATENT DOCUMENTS

| | | | |
|---|---|---|---|
| 6,693,350 B2 * | 2/2004 | Teshima et al. ............... | 257/712 |
| 2004/0089940 A1 | 5/2004 | Mamitsu et al. | |

FOREIGN PATENT DOCUMENTS

| | | |
|---|---|---|
| JP | 2001-230373 A | 8/2001 |
| JP | 3525832 B2 | 5/2004 |
| JP | 2006-216641 A | 8/2006 |
| JP | 2009-224560 A | 10/2009 |

OTHER PUBLICATIONS

International Search Report dated Dec. 6, 2011 w/English translation (two (2) pages).

* cited by examiner

*Primary Examiner* — Thanh V Pham
(74) *Attorney, Agent, or Firm* — Crowell & Moring LLP

(57) ABSTRACT

A power semiconductor module includes a power semiconductor element formed with a plurality of control electrodes on one main surface, a first conductor plate bonded by way of a first solder material to one of the main surfaces of the power semiconductor element, and a second conductor plate bonded by way of a second solder material on the other main surface of the power semiconductor element. A first protrusion section protruding from the base section of the applicable first conductor plate and including a first protrusion surface formed over the upper side, is formed over the first conductor plate. A second protrusion section including a second protrusion surface formed facing opposite one of the main surfaces of the power semiconductor element. The first solder material is interposed between the power semiconductor element and the first conductor plate while avoiding the plural control electrodes. If there is an projection from a perpendicular direction by one of the main surfaces of the power semiconductor element, the second protrusion section is formed so that the projecting section on a specified side of the second protrusion surface overlaps the projecting section of the step section formed between the base section of the first conductor plate and the first protrusion section. The plural control electrodes on the power semiconductor element are formed along the specified side of the second protrusion surface.

3 Claims, 16 Drawing Sheets

POWER SEMICONDUCTOR MODULE AND MANUFACTURING METHOD THEREOF

TECHNICAL FIELD

The present invention relates to a power semiconductor module and manufacturing method for that power semiconductor module, and relates in particular to a power semiconductor module and manufacturing method utilized in hybrid electric vehicles and regular electric vehicles.

BACKGROUND ART

Viewed in terms of energy saving, automobiles require high fuel efficiency to achieve and this need has served to focus attention on electric vehicle driven by a (electric) motor and hybrid electric vehicles driven by a combination of engine and (electric) motor. However driving and regulating the large-capacity on-board motors in automobiles by direct current (DC) voltage from a battery is difficult. This situation makes use of a power converter utilizing power semiconductor chip switching indispensable for boosting the direct current voltage and also for alternating current (AC) regulation. The power semiconductor chips utilized for these tasks emit vast quantities of heat when power is supplied and so require high heat dissipating performance.

The patent document 1 discloses a semiconductor device capable of cooling from both sides of the power semiconductor chip.

The technology in patent document 1 discloses a structure for insertion of a spacer and a securing a space for that spacer in order attain a dielectric capable of withstanding voltages at an electrical coupling utilizing a metal wire to a control electrode mounted separately from the main electrode, when electrically coupling a main electrode mounted over the surface of the power semiconductor chip.

However, the heat dissipating efficiency of the power semiconductor chip will vary according to how the spacer or the lead frame, convey the heat emitted from the power semiconductor chip. Moreover ensuring the withstand voltage of the metal wire must be considered when fabricating the spacer or the lead frame.

CITATION LIST

Patent Literature

Patent document 1: Japanese Patent No. 3525832

SUMMARY OF INVENTION

Technical Problem

The present invention has the object of providing both improved heat dissipation in the power semiconductor element utilized in the power semiconductor module, as well as ensuring a withstand voltage in peripheral components in the power semiconductor element.

Solution to Problem

A power semiconductor module according to a first aspect of the present invention includes a power semiconductor element containing a plurality of control electrodes over one main surface, a first conductor plate bonded by way of a first solder material to one of the main surface of the power semiconductor element, and a second conductor plate bonded by way of a second solder material to the other main surface of the power semiconductor element. A first protrusion section including a first protrusion surface formed over the upper side protruding from the base section of the applicable first conductor plate is formed over a first conductor plate; and a second protrusion section including a second protrusion surface formed facing towards one of the main surfaces of the power semiconductor element is formed over the first protrusion surface of the first conductor plate; there is a first solder material between the power semiconductor element and the first conductor plate and avoids the plural control electrodes; and in which if there is an projection from a perpendicular direction by one of main surfaces of a power semiconductor element, then the second protrusion section is formed so that the projecting section on a specified side of the second protrusion surface overlaps the projecting section of the step section formed between the base section of the first conductor plate and the first protrusion section. The plural control electrodes on the power semiconductor element are formed along one specified side of the second protrusion surface.

According to a second aspect of the present invention, the power semiconductor element in the power semiconductor module of the first aspect is preferably formed so that the control electrodes of the power semiconductor element face opposite the surface of the base section of the first conductor plate not forming a first protrusion section; and further are formed arrayed along a specified side of the second protrusion surface.

According to a third aspect of the present invention, in the power semiconductor module of the second aspect, the surface of the base section of the first conductor plate not forming a first protrusion section is preferably formed further away from the second protrusion surface than the first protrusion surface.

A power semiconductor module manufacturing method according to a fourth aspect of the present invention is a method for manufacturing a power semiconductor module including a first conductor plate facing opposite one of the main surfaces of the power semiconductor element and a second conductor plate facing opposite the other main surface of the power semiconductor element; and in which the manufacturing method further includes a first process implemented by drawing so that a specified two sides of the applicable first protrusion surfaces facing opposite each other respectively overlap the specified two sides the first conductor plates facing opposite each other, when the first protrusion section containing a first protrusion surface is formed over one surface of the first conductor plate; and a second process to form a second protrusion surface by pressing a portion of the first protrusion surface, when forming a second protrusion section containing a second protrusion surface along with forming the first protrusion surface.

A power semiconductor module manufacturing method according to a fifth aspect of the present invention, in which the first process in a power semiconductor module manufacturing method of the fourth aspect preferably includes a process to coat metal plating bonded to the solder material on the first protrusion surface.

Advantageous Effects of Invention

The present invention is capable of achieving both improved heat dissipation in the power semiconductor element utilized in the power semiconductor module, as well as

DESCRIPTION OF EMBODIMENTS

The power converter of the embodiment of the present invention is described next while referring to the accompanying drawings. The power converter of the embodiment of the present invention is applicable to hybrid electric vehicles and genuine electric vehicles. The control structure and circuit structure of the power converter of the embodiment of the present invention are described utilizing FIG. 1 and FIG. 2 for power converter adapted to hybrid electric vehicles.

Figure 1:
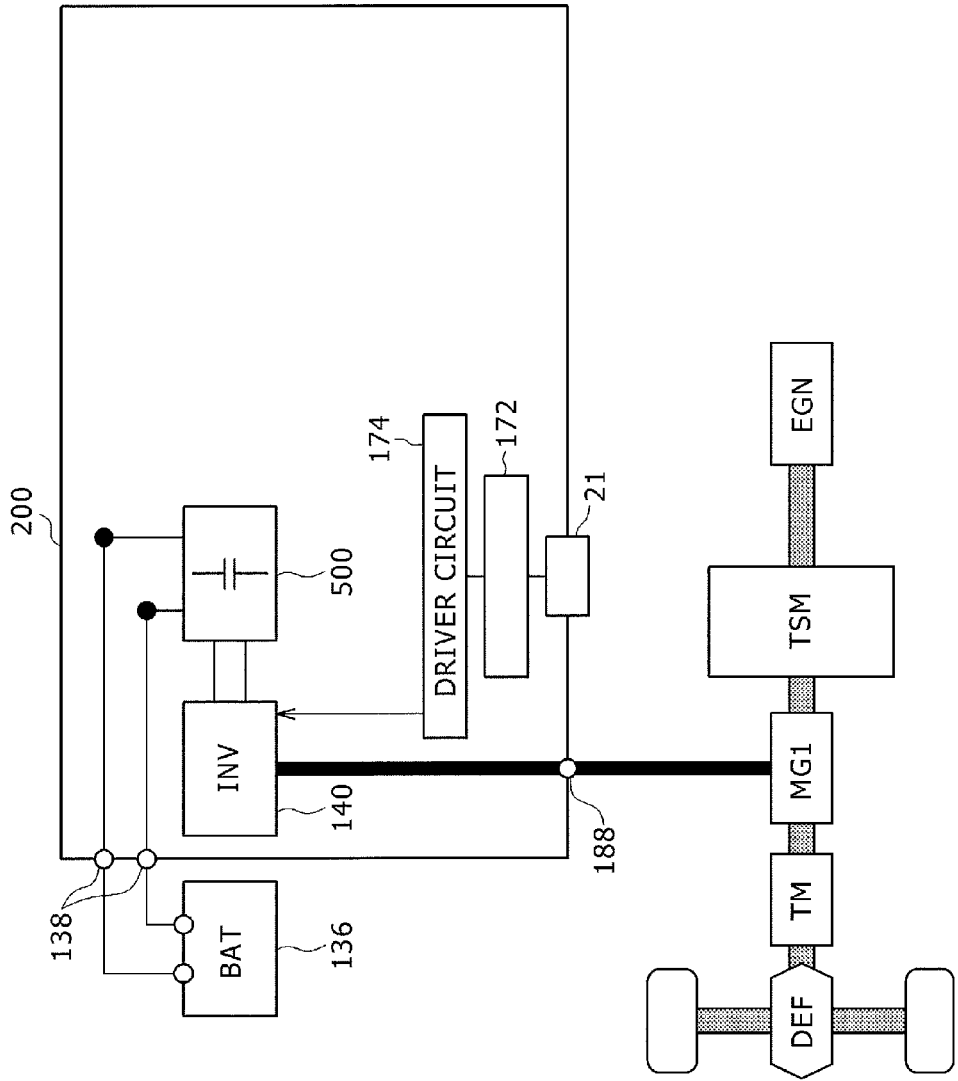
FIG. 1 is a circuit diagram showing the control block for a hybrid electric vehicle.

FIG. 1 is a circuit diagram showing the control block for a hybrid electric vehicle. An engine EGN and motor-generator MG1 generate the torque for driving the vehicle. The motor-generator MG1 not only generates rotational torque but also includes a function to convert mechanical energy applied from external sources to the motor-generator MG1 into electrical power.

The motor-generator MG1 is for example a synchronous machine or an induction machine and as related above may operate as an electrical generator and as a motor according to the drive method. The motor-generator MG1 is preferably small and provides a high output when mounted in an automobile, and is ideal for permanent magnet type synchronous motors using magnets such as neodymium. Moreover, permanent magnet type synchronous motors emit less heat from the rotor compared to induction motors and in that respect are excellent for use in automobiles.

The output torque on the output side of the engine is conveyed to the motor-generator MG1 byway of a power distributor mechanism TSM. The rotational torque from the power distributor mechanism TSM or the rotational torque generated by the motor-generator MG1 is transmitted to the vehicle wheels by way of the transmission TM and the differential gears DEF. During driving with regenerative braking, the rotational torque from the vehicle wheels is transmitted to the motor-generator MG1. The motor-generator MG1 generates alternating current (hereafter "AC") power based on the rotational torque supplied from the vehicle wheels. The generated AC power is converted to direct current (hereafter, "DC") power by the power converter 200 as described later on and charges the high-voltage battery 136. The electrical power charged in the battery 136 is reutilized as (vehicle) drive energy.

The power converter 200 is described next. An inverter circuit 140 is electrically coupled by way of a direct current connector 138 to the battery 136. The battery 136 and the inverter circuit 140 mutually exchange electrical power. When operating the motor-generator MG1 as a motor, the inverter circuit 140 generates AC electrical power based on the DC power supplied by way of the direct current connector 138 from the battery 136, and supplies this AC power by way of the alternating current (AC) terminal 188 to the motor-generator MG1. The structure comprised of the motor-generator MG1 and the inverter circuit 140 functions as a first motor-generator unit.

In the present embodiment, the vehicle can be driven just by the motive power from the motor-generator MG1, by operating the first motor-generator unit as a motor unit driven by battery power from the battery 136. Also in this embodiment, the first motor-generator unit can be operated from the engine motive power or by electrical power from the vehicle wheels, as a generator to charge the battery 136.

Though omitted in FIG. 1, the battery 136 can also be utilized as a power source for driving an auxiliary motor. The auxiliary motors may include for example motors to drive compressors for air conditioners or motors to drive hydraulic pumps for control purposes. The direct current (or DC power) from the battery 136 is supplied to the auxiliary power module, and the auxiliary power module generates an alternating current (or AC power) and supplies that AC power to the auxiliary motor. The auxiliary power module contains basically the same circuit structure and functions as the inverter circuit 140, and regulates the frequency and phase of the alternating current and electrical power supplied to the auxiliary motor. The power converter 200 includes a condenser module 500 for smoothing the DC power supplied to the inverter circuit 140.

The power converter 200 contains a communication connector 21 for receiving commands from a higher ranking control device or for sending data expressing the status to an upper-ranking control device. The power converter device 200 processes the motor-generator MG1 control quantity in a control circuit 172 based on commands input from the connector 21, and also calculates whether to operate as a motor or operate as a generator. Based on these processing results, the control circuit 172 emits control pulses and supplies those control pulses to the driver circuit 174. Based on the control pulses that were supplied, the driver circuit 174 generates drive pulse for controlling the inverter circuit 140.

Figure 2:
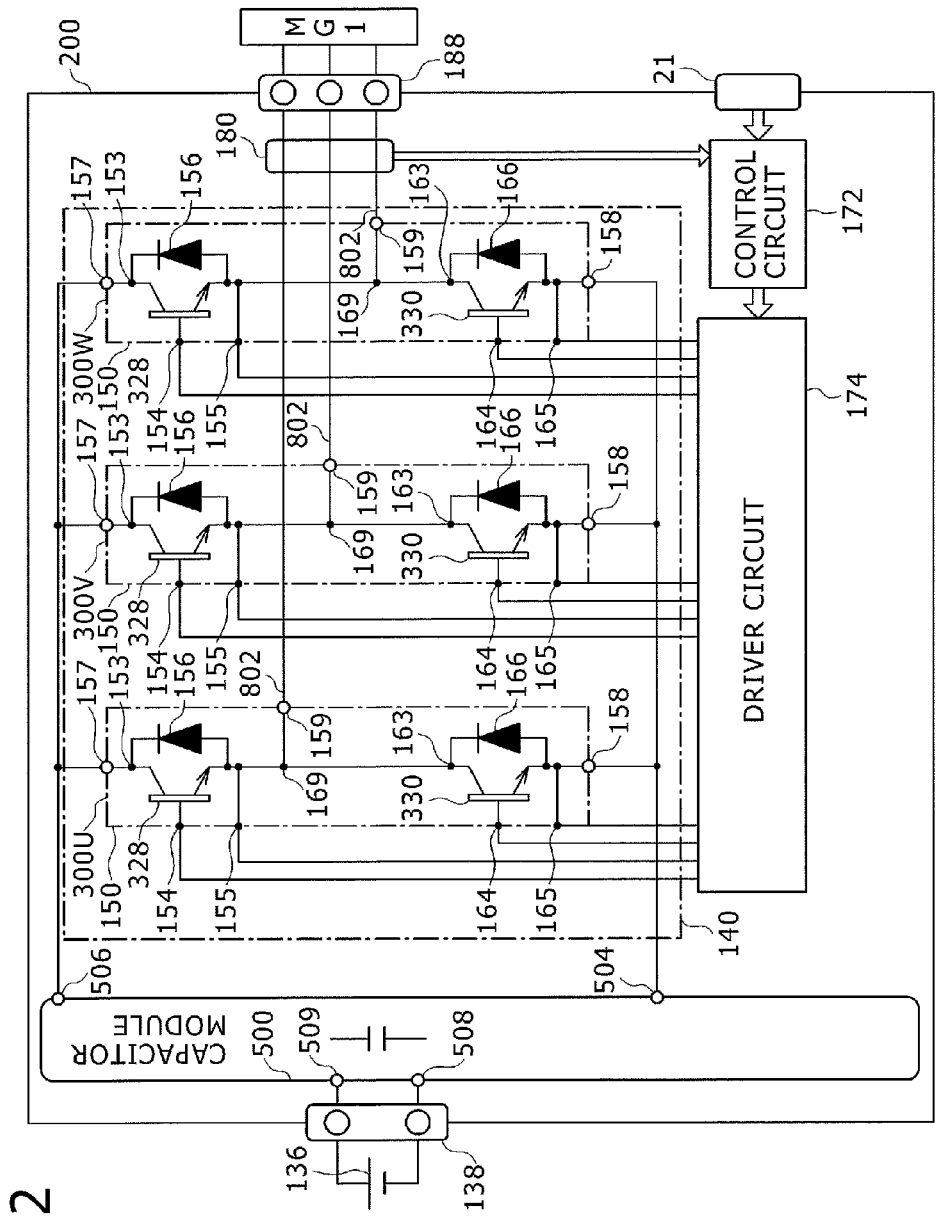
FIG. 2 is a circuit diagram showing the structure of the electrical circuit of the inverter circuit 140 in FIG. 1.

The structure of electrical circuit for the inverter circuit 140 is described next while referring to FIG. 2. The following example utilizes an insulated-gate bipolar transistor as the power semiconductor element which is abbreviated to IGBT from here onwards. An upper/lower arm series circuit 150 is configured from an IGBT328 and diode 156 operating as the upper arm; and an IGBT330 and diode 166 operating as the lower arm. The inverter circuit 140 includes this series circuit 150 corresponding to the three-phase U-phase, V-phase, and W-phase of AC power for output.

These three phases correspond to each of the three phase windings for the armature winding of the motor-generator MG1 in the present embodiment. The upper/lower armature series circuit 150 for these three phases outputs an alternating current from the intermediate electrode 169 at the midpoint section of this series circuit. This intermediate electrode 169 is coupled to the motor-generator MG1 by way of the alternating current bus bar 802 that couples between the alternating current (AC) terminal 159 and the alternating current (AC) terminal 188.

A collector electrode 153 on the upper arm of the IGBT 328 is electrically coupled by way of a positive terminal 157 to the condenser terminal 506 on the positive terminal side of the condenser module 500. The emitter terminal of the IGBT330 over the lower arm is electrically coupled by way of the negative terminal 158 to the condenser terminal 504 on the negative side of the condenser module 500.

The control circuit 172 as already described, receives control commands by way of the connector 21 from the upper ranking control device, and based on these commands, emits control pulses serving as control signals for controlling the IGBT328 or IGBT 330 configuring the upper armature or the lower armature of the series circuits 150 for each phase, within the inverter circuit 140, and supplies these control pulses to the driver circuit 174.

The driver circuit 174 supplies drive pulses for controlling the IGBT328 or IGBT330 configuring the upper arm or lower arm of the each phase of the series circuit 150, to the IGBT328 or IGBT30 for each phase. The IGBT328 or IGBT330 conducts or cuts off the power based on drive pulses from the driver circuit 174, and converts the three-phase DC power supplied from the battery 136, to three-phase AC power. This converted electrical power is supplied to the motor-generator MG1.

The IGBT328 includes a collector electrode 153, a signal emitter electrode 155, and a gate electrode 154. The IGBT330 includes a collector electrode 163, and a signal emitter electrode 165, and a gate electrode 164. The diode 156 is electrically coupled between the collector electrode 153 and the emitter electrode 155. The diode 166 is electrically coupled between the collector electrode 163 and the emitter electrode 165.

A metal oxide semiconductor field effect transistor (hereafter abbreviated to MOSFET) may be utilized as the switching power semiconductor and in that case the diode 156 and the diode 166 are not necessary. An IGBT is ideal as a switching power semiconductor element for cases where the direct current voltage is comparatively high, and the MOSFET is ideal for cases where the direct current voltage is comparatively low.

The condenser module 500 include a positive side condenser terminal 506 and a negative side condenser terminal 504 and a positive side power supply terminal 509 and a negative side power supply terminal 508. The high voltage DC power from the battery 136 is supplied by way of the direct current (DC) connector 138 to the positive side power supply terminal 509 and the negative side power supply terminal 508; and is supplied to the inverter circuit 140 from the positive side condenser terminal 506 and a negative side condenser terminal 504 of the condenser module 500.

The DC power converted from AC power by the inverter circuit 140 on the other hand, is supplied to the condenser module 500 from the positive side condenser terminal 506 and the negative side condenser terminal 504; and is supplied to the battery 136 from the positive side power supply terminal 509 and the negative side power supply terminal 508 by way of the DC connector 138 and is accumulated in the battery 136.

The control circuit 172 contains a microcomputer for processing the switching timing of the IGBT328 and IGBT330. The information input to the microcomputer is the target torque value required for the motor-generator MG1, the direct current value supplied to the motor-generator MG1 from the series circuit 150; and the magnetic pole position of the rotor for the motor-generator MG1.

The target torque value is a value based on the command signal output from an upper ranking control device not shown in the drawing. The electrical current value is detected based on a detection signal from the current sensor 180. The magnetic pole position is detected based on the detection signal output from the rotational magnetic pole sensor (not shown in drawing) such as a resolver mounted in the motor-generator MG1. The present embodiment utilizes an example for the case where the three-phase electrical current value is detected by a current sensor 180, however a two-phase portion of the electrical current value may be detected and a three-phase portion of the electrical current may be found by calculation.

The microcomputer within the control circuit 172 calculates the electrical current command values for the d axis and q axis of the motor-generator MG1 based on the target torque values; and calculates the voltage command values for the d axis and the q axis based on the difference between the calculated d axis and q axis current command values and the detected d axis and q axis current values; and converts the calculated d axis and q axis voltage command values into U phase, V phase and W phase voltage command values based on the detected magnetic pole positions. The microcomputer next generates pulse modulation waves] based on a comparison of the basic wave (sine wave) and carrier wave (triangular wave) based on the U phase, V phase and W phase voltage command values, and outputs those generated modulated waves to the driver circuit 174 as PWM (pulse width modulation) signals.

When driving the lower armature, the driver circuit 174 outputs a drive signal with an amplified PWM signal to the gate electrode 164 of IGBT330 of the corresponding lower arm. When driving the upper arm, the driver circuit 174 shifts the reference electric potential level of the PWM signal to the reference electric potential level of the upper arm, and next amplifies the PWM signal, and utilizing these amplified PWM signals as drive signals, outputs these drive signals to the gate electrodes 154 of the IGBT328 of corresponding upper arms.

The microcomputer within the control circuit 172 performs abnormal detection (excessive current, excessive voltage, excessive temperature, etc.) to protect the series circuit 150. Sensing information is therefore input to the control circuit 172. Information on the electrical current flowing in each of the IGBT328 and IGBT330 emitter electrodes from each of the arm signal emitter electrodes 155 and signal emitter electrode 165 is for example input to the corresponding drive unit (IC). A check to detect excessive electrical current is in this way made in each drive unit (IC), and if excessive electrical current is detected, then the switching operation of the corresponding IGBT328, IGBT330 is stopped, to protect the corresponding IGBT328 and IGBT330 from excessive electrical current.

The series circuit 150 temperature information from the temperature sensor (not shown in drawing) mounted in the series circuit 150 is input to the microcomputer. The direct current side positive voltage information of the series circuit 150 is also input to the microcomputer. The microcomputer performs excessive temperature and excessive voltage detection based on that information, and if excessive temperatures or excessive voltages are detected, stops all switching operation of the IGBT328 and IGBT330.

A detailed description of the power modules (power semiconductor modules) 300U, 300V, 300W (see FIG. 2) used in the inverter circuit 140 is described while referring to FIG. 3 through FIG. 7. The above power modules 300I3 through 300W all utilize the same structure, and the structure of the power module 300U is described as an example. FIG. 8 is a circuit diagram for describing the placement of the power semiconductor elements (IGBT328 or diode 156, etc.) and conductor plate, in relation to the power module 300I3 shown in FIG. 3 through FIG. 7.

FIG. 3(a) is a perspective view of the power module 300U of the present embodiment. FIG. 3(b) is a cross sectional view of the power module 300I3 of the present embodiment as seen from the direction E along the cross section D.

Figure 3:
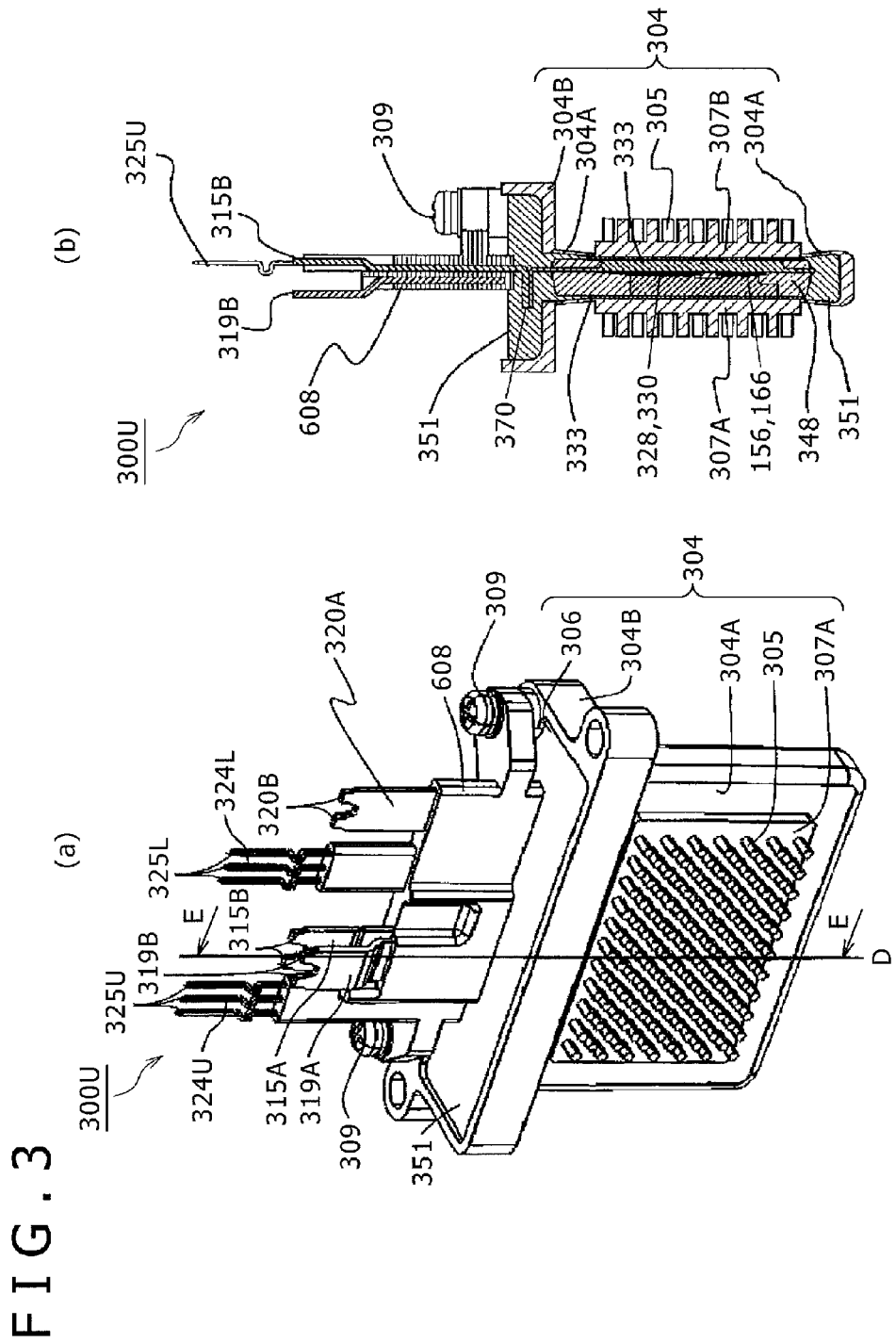
FIG. 3(a) is a perspective view of the power module 300U of the present embodiment.
FIG. 3(b) is a cross sectional view of the power module 300U of the present embodiment as seen from the direction E along the division of cross section D.
Figure 4:
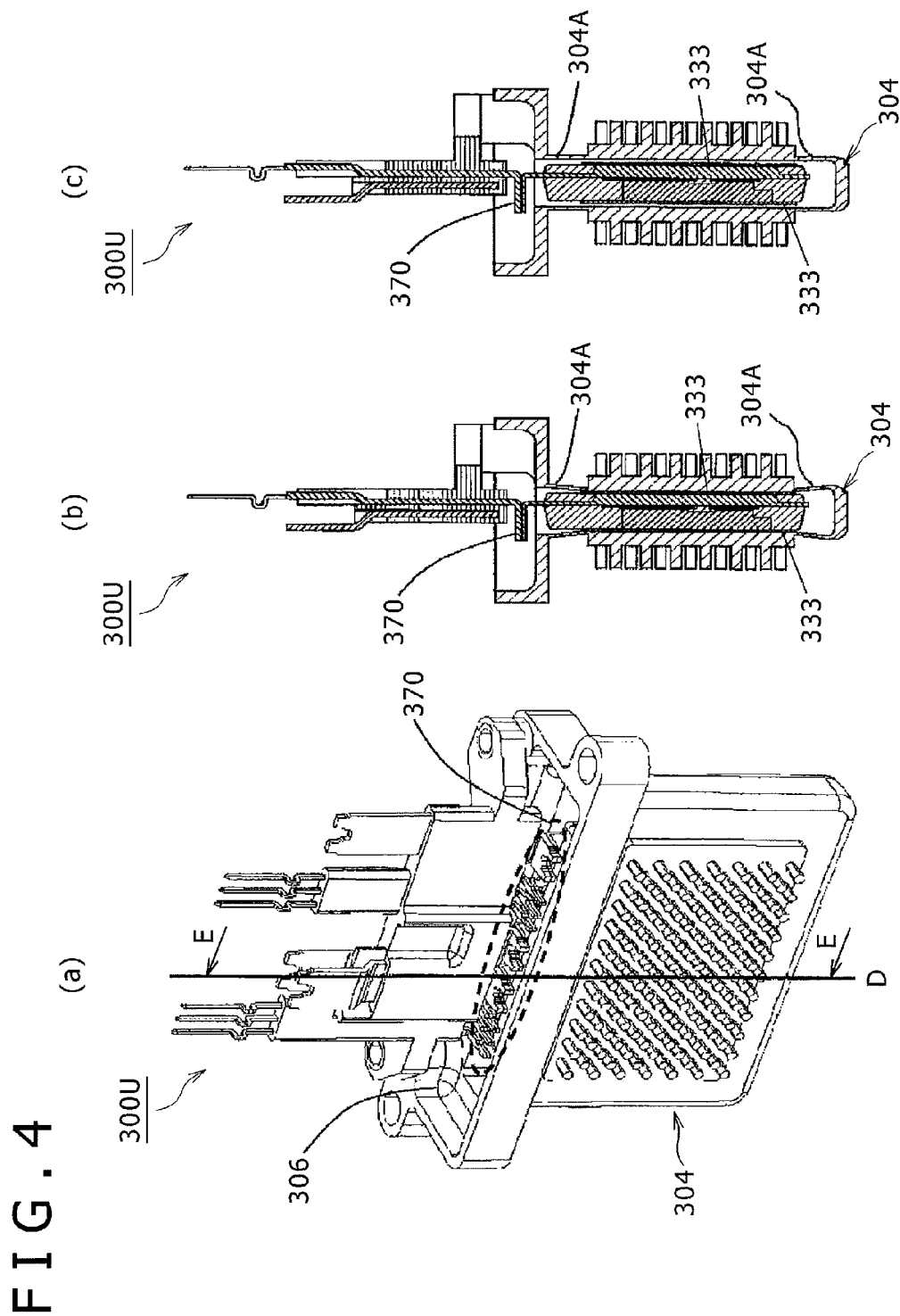
FIG. 4(a) is a perspective view of the power module 300U with the screw 309 and the second sealing resin 351 removed from the state shown in FIG. 3(a)
FIG. 4(b) is a cross sectional view of that power module 300U as seen from the direction E along the division of cross section D.
FIG. 4(c) is a cross sectional view of the power module 300U before a curved section 304A is deformed due to a fin 305 that pressure was applied.

FIG. 4 is a drawing showing the power module 300I3 with the screw 309 and the second sealing resin 351 removed from the state shown in FIG. 3. FIG. 4(a) is a perspective view. FIG. 4(b) is a cross-sectional view as seen from the direction E along the division of cross section D the same as in FIG. 3(b). FIG. 4(c) is a cross sectional view before a curved section 304A is deformed due pressure was applied the fin 305.

Figure 5:
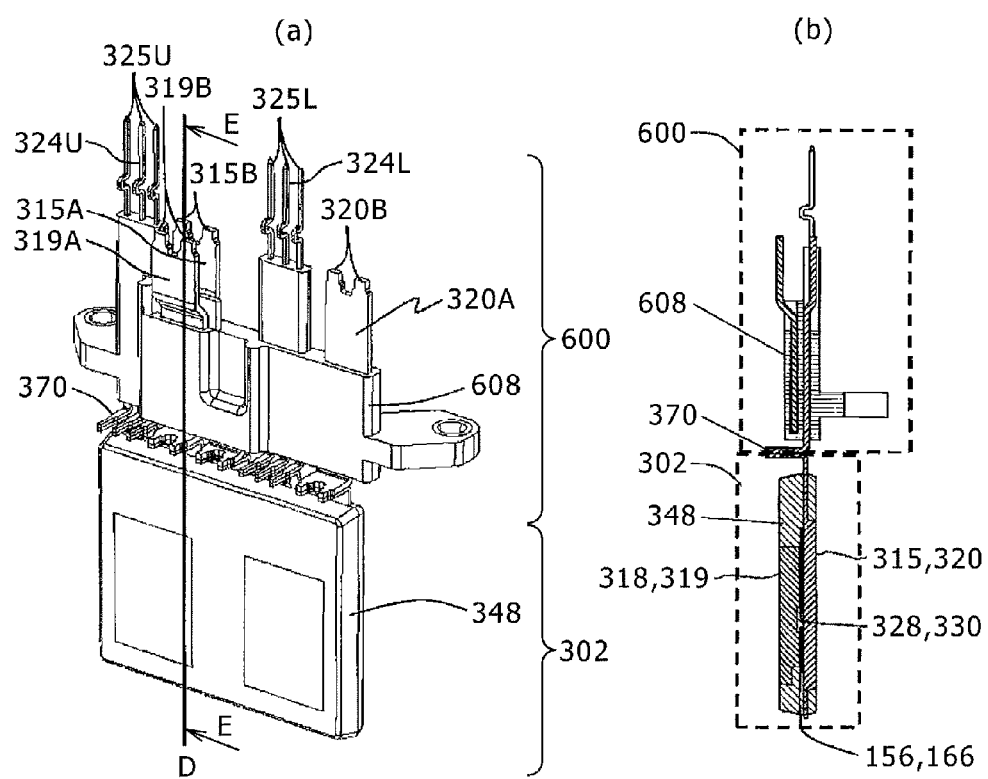
FIG. 5(a) is a perspective view of the power module 300U with the module case 304 further removed from the state shown in FIG. 4(a)
FIG. 5b is a cross sectional view as seen from the direction E along the division of cross section D of this power module 300U.

FIG. 5 is a drawing showing the power module 300U with the module case 304 further removed from the state shown in FIG. 4. FIG. 5(a) is a perspective view. FIG. 5(b) is a cross-sectional view as seen from the direction E along the cross section D, the same as in FIG. 3(b) and FIG. 4(b).

Figure 6:
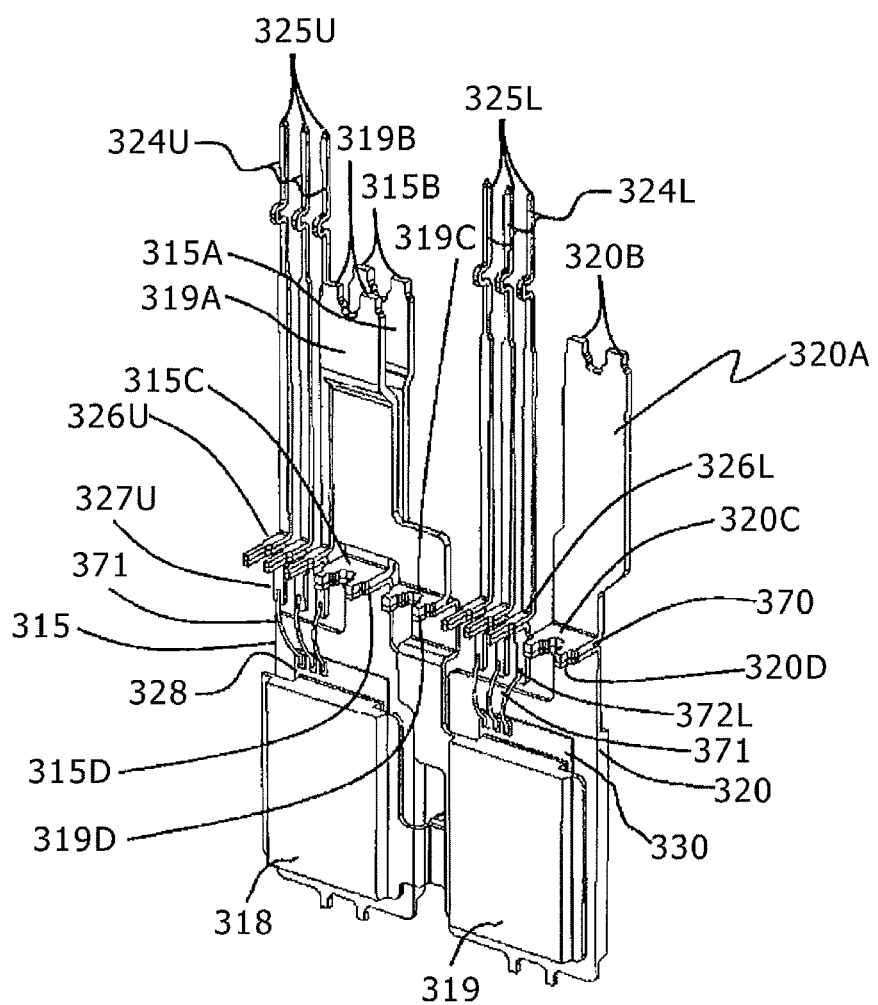
FIG. 6 is a perspective view of the power module 300U with the first sealing resin 348 and the wire insulation unit 608 further removed from the state shown in FIG. 5(a)

FIG. 6 is a perspective view of the power module 300U with the first sealing resin 348 and the wire insulation unit 608 also removed from the state shown in FIG. 5.

Figure 7:
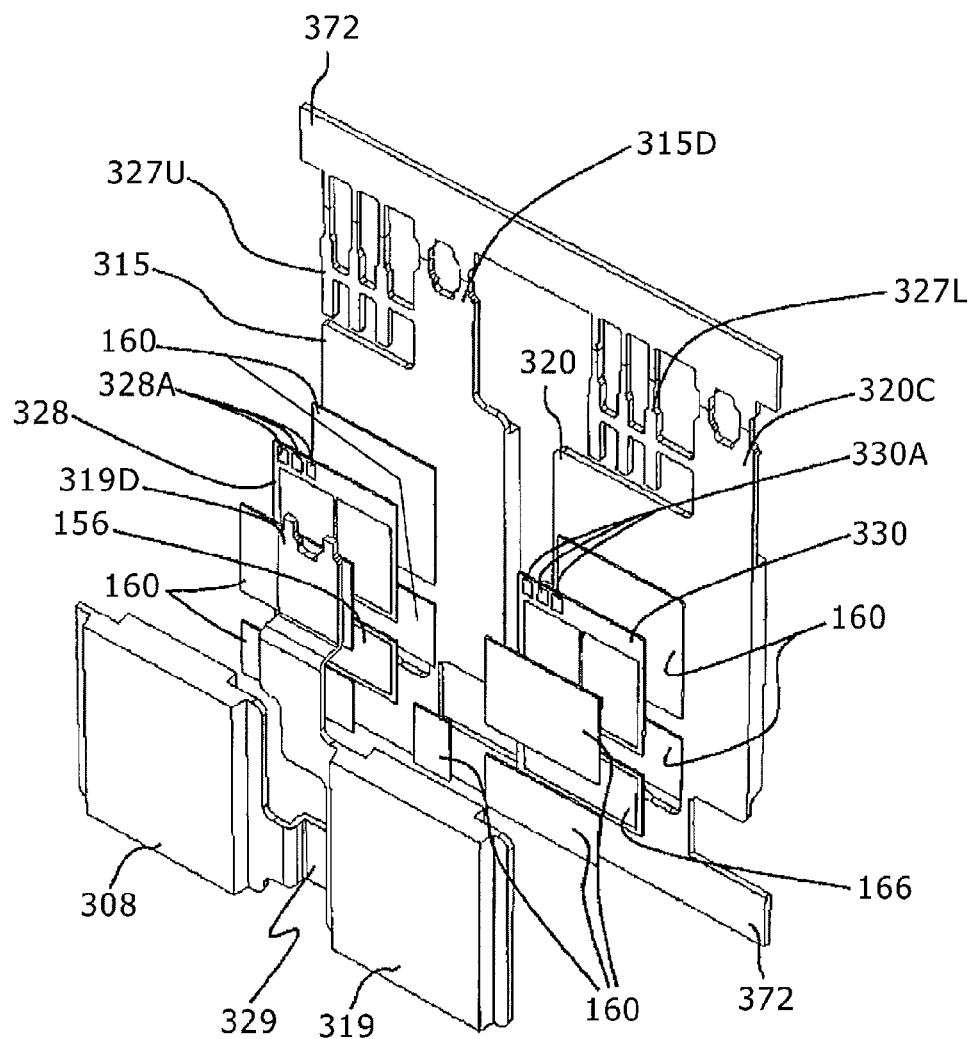
FIG. 7 is a drawing for describing the assembly process for the module primary sealing piece 302.
Figure 8:
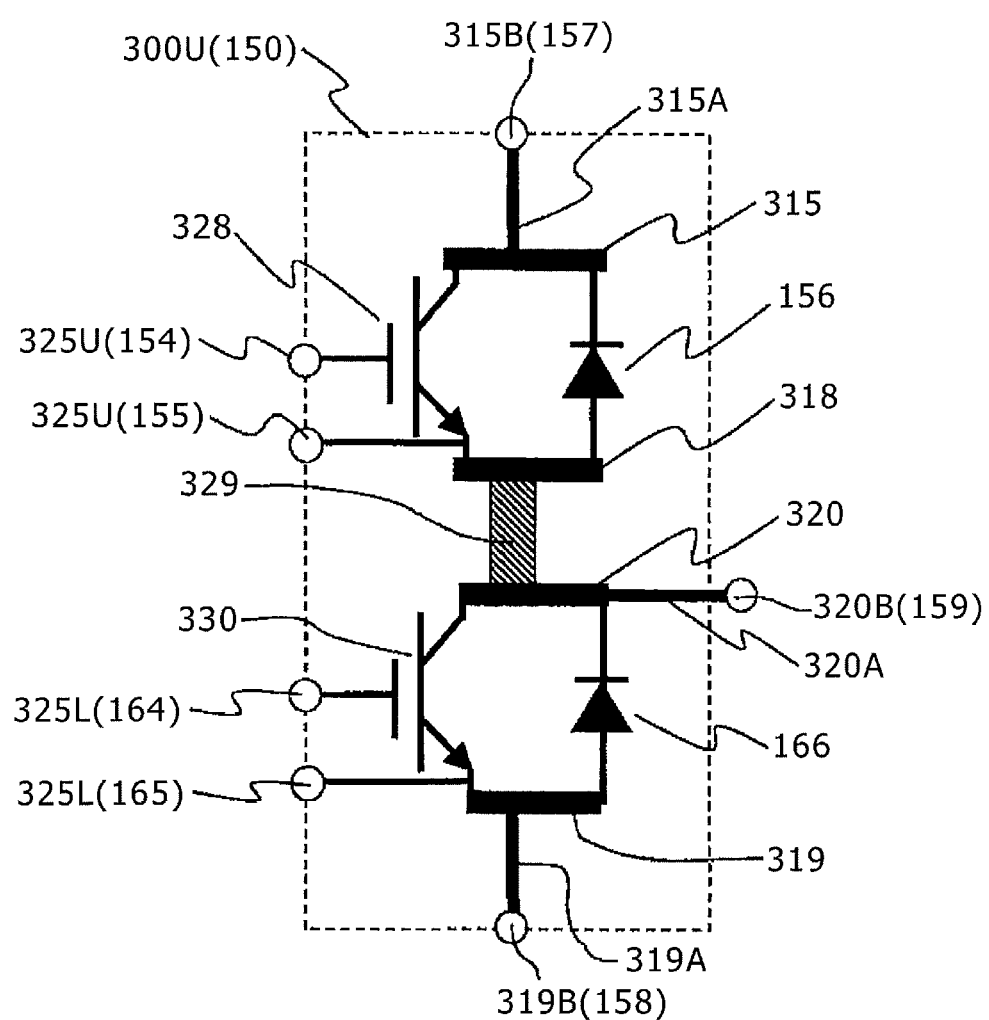
FIG. 8 is a circuit diagram for describing the relation between the placement of the power semiconductor elements (IGBT328 or diode 156, etc.) and conductor plate, with the power module 300U shown in FIG. 3 through FIG. 7.

FIG. 7 is a drawing for describing the assembly process for the module primary sealing piece 302.

The power semiconductor elements (IGBT328, IGBT330, diode 156, diode 166) configuring the upper and lower armature series circuit 150 are fastened by enclosure from both surfaces by the conductor plate 315 and conductor plate 318, or the conductor plate 320 and conductor plate 319 as shown in FIG. 5 through FIG. 7. The conductor plate 315 and so on as shown in FIG. 5 are sealed by the first sealing resin 348 in a state with the heat dissipating surfaces exposed, and the insulation sheets 333 (See FIG. 4(c)) are thermo-compression bonded to the applicable heat dissipating surfaces. The first sealing resin 348 is a multi-surface shape (here, a roughly rectangular solid or cuboid) as shown in FIG. 5.

The module primary sealing piece 302 sealed by the first sealing resin 348 is inserted into the module case 304, encloses the insulation sheets 333 and thermo-compression bonded to the internal surfaces of the module case 304 (See FIG. 4(b)) serving as a CAN cooler. Here, the CAN cooler as shown in FIG. 4(a), is a pipe-shaped cooling device having an insertion slot 306 on one surface, and a bottom on the other surface. A second sealing resin 351 is filled into the gap remaining inside the module case 304 as shown in FIG. 3.

The module case 304 is comprised of member possessing electrical conductivity such as an aluminum alloy material (Al, AlSi, AlSiC, Al—C etc.) and moreover is integrated into one seamless shape. The module case 304 has a structure with no opening other than the insertion slot 306. The insertion slot 306 is enclosed on its outer circumference by a flange 304(b). Moreover, the first heat dissipation surface 307A and the second heat dissipation surface 307B having surfaces wider than the other side, are placed at respectively opposite positions as shown in FIG. 3(a) and FIG. 3(b), and each of the power semiconductor elements (IGBT328, IGBT330, diode 156, diode 166) are positioned facing these heat dissipation surfaces. The three surfaces joining the first heat dissipation surface 307A and the second heat dissipation surface 307B configure surfaces sealed with a smaller width than the applicable first heat dissipation surface 307A and second heat dissipation surface 307B, and an insertion slot 306 is formed on the remaining single side.

The shape of the module case 304 need not be a rectangular solid and may be formed with a curved surface such as the angle in FIG. 3(a). By utilizing a metal case with this type of shape, the flange 304(b) can maintain the sealing against coolant, and a structure is attained that easily prevents the intrusion of a coolant medium into the inside of the module case 304 even if the module case 304 is inserted within a flow path (not shown in drawing) where coolant such as water or oil is flowing. The fins 305 are respectively formed uniformly over the first heat dissipation surface 307A and second heat dissipation surface 307B. A curved section 304A with a drastically thin thickness is moreover formed at the outer circumference of the first heat dissipation surface 307A and the second heat dissipation surface 307B. The curved section 304A is drastically thin to the extent of allowing easy deformation by applying pressure to the fins 305 so that productivity can be improved after insertion of the module primary sealing piece 302.

Using thermo-compression bonding to bond for example the conductor plates 315 by way of the insulation sheets 333 to the inner walls of the module case 304 as described above serves to reduce the gap between the inner walls of the module case 304 and for example the conductor plates 315; and also efficiently conveys the heat emitted by the power semiconductor element to the fins 305. Providing a certain extent of thickness and flexibility in the insulation sheet 333 further allows the insulation sheets 333 to absorb the thermal stress that was generated, and allows satisfactory usage in vehicular power converters that operate under harsh temperature fluctuations.

A metal direct current (DC) positive wire 315A and direct current (DC) negative wire 319A electrically coupled to the condenser module 500 are formed on the outside of the module case 304 as shown in FIG. 3(a). A direct current (DC) positive terminal 315B (157) and the direct current (DC) negative terminal 319B (158) are respectively formed on the tip section of those wires. A metal alternating current (AC) wire 320 is mounted for supplying AC power to the motor-generator MG1; and an alternating current (AC) terminal 320B (159) is formed on that tip. In the present embodiment as shown in FIG. 6 and FIG. 8, the DC positive wire 315A is coupled to the conductor plate 315; the DC negative wire 319A is coupled to the conductor plate 319; and the AC wire 320A is coupled to the conduction sheet 320.

A metal signal wire 324U and 324L are mounted on the outside of the module case 304 as shown in FIG. 3(a) in order to electrically couple to the driver circuit 174. A signal terminal 325U (154, 155) and signal terminal 325L (164, 165) are respectively formed on the tip sections signal wire 324U and 324L. In the present embodiment, the signal wire 324' is coupled to the IGBT 328, and the signal wire 324L is coupled to the IGBT 330.

The DC positive wire 315A, the DC negative wire 319A, the AC wire 320A, the signal wire 324U and the signal wire 324L are molded into a signal piece as the auxiliary mold piece 600 in a state where mutually insulated from each other by a wire insulation section 608 formed from resin mold. The wire insulation unit 608 renders the effect of a support member to support each wire, and the resin material utilized in this wire insulation unit 608 can utilize thermosetting resin or thermoplastic resin having insulating properties. Insulation can in this way be maintained among the DC positive wire 315A, the DC negative wire 319A, the AC wire 320A, the signal wire 324U and the signal wire 324L, and high density wiring can also be achieved. The auxiliary mold piece 600 is metallically bonded to the module primary sealing piece 302 and the coupling piece 370, and next clamped to the module case 304 by a screw 309 passing through the screw hole formed in the wire insulation unit 608 (See FIG. 3). The metal bonding of the module primary sealing piece 302 and the auxiliary mold piece 600 on the coupling piece 370 can be accomplished for example by TIG welding, etc.

The DC positive wire 315A and the DC negative wire 319A are formed in a shape extending roughly in parallel and mutually stacked in a state facing opposite each other while enclosing the wire insulation unit 608. By utilizing this type of placement and shape, the instantaneous current flowing during switching by the power semiconductor element flows in an opposing and inverse direction. The effect from this opposing flow is that the magnetic fields created by the current mutually cancel each other out, and this effect allows low inductance in the circuit. The AC wire 320A and signal wires 324U, 324L also extend facing in the same direction as the DC positive wire 315A and the DC negative wire 319A.

The coupling piece 370 coupled by the metal bonding of the module primary sealing piece 302 and auxiliary mold piece 600, is sealed within the module case 304 by the second sealing resin 351 as shown in FIG. 3(b). The required insulation distance can in this way be stably maintained between the coupling piece 370 and the module case 304 so that a small shape can be maintained for the power module 300 compare to when there is no sealing.

As shown in FIG. 6, an auxiliary module side direct current (DC) positive connector terminal 315C, an auxiliary module side direct current (DC) negative connector terminal 319C, auxiliary module side alternating current (AC) connector terminal 320C, an auxiliary module side signal connector terminal 326U, and an auxiliary module side signal connector terminal 326L are arrayed in a row on the auxiliary mold piece 600 side of the coupling piece 370. An element side direct current (DC) positive connector terminal 315D, an element side direct current (DC) negative connector terminal 319D, an element side alternating current (AC) connector terminal 320D, an element side signal connector terminal 327U, and an element side signal connector terminal 327L are arrayed in a row along one side of the first sealing resin 348 having a multi-surface shape in the module primary sealing piece 302 of the coupling piece 370. Utilizing this type of structure where the terminals are arrayed in a row in the coupling piece 370 allows achieving a simple structure for the module primary sealing piece 302 in the transfer mold.

The positional relationship of each terminal as seen from one terminal for each type of section extending outwards from the first sealing resin 348 of the module primary sealing piece 302 is described here. In the following description, the terminals comprised of the DC positive wire 315A (including the DC positive terminal 315B and auxiliary module side DC positive connector terminal 315C) and the element side DC positive connector terminal 315D are given the collective name of positive terminals; and the terminals comprised of the DC negative wire 319A (including the DC negative terminal 319B and auxiliary module side DC negative connector terminal 319C) and element side DC negative connector terminal 319D are given the collective name of negative terminals; the terminals comprised of the AC wire 320A (including the AC terminal 320B and auxiliary module side AC connector terminal 320C) and the element side AC connector terminal 320D are given the collective name of output terminals; the terminals comprised of the signal wire 324U (including the signal terminal 325U and auxiliary module side signal connector terminal 326U) and the element side signal connector terminal 32713 are given the collective name of upper arm signal terminals; and the terminals comprised of the signal line 324L (including the signal terminal 325L and auxiliary module side signal connector terminal 326L) and the element side signal connector terminal 327L are given the collective name of lower arm signal terminals.

Each of the above terminals protrudes outwards from the first sealing resin 348 and the second sealing resin 351. Each protruding section from the first sealing resin 348 (element side DC positive connector terminal 315D, an element side DC negative connector terminal 319D, an element side AC connector terminal 320D, an element side signal connector terminal 32713 and an element side signal connector terminal 327L) is arrayed in a row along one side of the first sealing resin 348 having a multi-surface shape as described above. Moreover, the positive terminals and negative terminals protrude in a laminated layer state from the second sealing resin 351, and extend out from the module case 304. Utilizing this type of structure prevents the gap in the metal mold and excessive stress on the section coupling the power semiconductor device and applicable terminal from occurring, when molding for manufacturing a module primary sealing piece 302 that uses the first sealing resin 348 to seal the power semiconductor element. Moreover, the current flowing in the reverse direct of each of the laminated positive side terminals and negative side terminals causes the magnetic flux to mutually cancel out in those directions so that a low inductance can be achieved.

The auxiliary module side DC positive connector terminal 315C and the auxiliary module side DC negative connector terminal 319C are respectively formed on tips sections of the DC positive wire 315A, DC negative wire 319A on the side opposite the DC positive terminal 315B and the DC negative terminal 319B on the auxiliary mold piece 600 side. The auxiliary module side AC connector terminal 320C is formed on the tip section on the side opposite the AC terminal 320B for the AC wire 320A. The auxiliary module side signal connector terminals 326U, 326L are respectively formed on the tip sections on the side opposite the signal terminals 325U, 325L for the signal lines 324U, 324L.

On the module primary sealing piece 302 on the other hand, the element side DC positive connector terminal 315D, the element side DC negative connector terminal 319D, and the element side AC connector terminal 320D are respectively formed on the conductor plates 315, 319, 320. The element side signal connector terminal 327U and the element side signal connector terminal 327L are respectively coupled by the bonding wire 371 to the IGBT 328, 330.

The assembly process for the module primary sealing piece 302 is described next while referring to FIG. 7.

The DC positive side conductor plate 315 and the AC output side conductor plate 320, and the element side signal connector terminal 327U and 327L are processed in an integrated manner for placement on roughly the same flat surface state in the state where coupled to a common tie bar 372 as shown in FIG. 7. The collector electrode of the upper arm side of the IGBT 328 and the cathode electrode on the upper arm side of the diode 156 are attached to the conductor plate 315. The collector electrode of the lower arm side of the IGBT 330 and the cathode electrode on the lower arm side of the diode 166 are attached to the conductor plate 320. The conductor plate 318 and the conductor plate 319 are placed in roughly a flat surface state above the IGBT 328, 330 and diodes 156 and 166. An emitter electrode for the upper arm side of the IGBT 328 and an anode electrode for the upper arm side of the diode 156 are attached to the conductor plate 318. An emitter electrode for the lower arm side of the IGBT 330 and an anode electrode for the lower arm side of the diode 166 are attached to the conductor plate 319. Each power semiconductor element is respectively attached to the respective conductor plate by way of the metal junction 160.

Each power semiconductor element has a plate shape with a flat, planar structure and each electrode on the applicable power semiconductor element is formed over the front and rear surfaces. Each of the electrodes on the power semiconductor element is enclosed by the conductor plate 315 and conductor plate 318, or the conductor plate 320 and conductor plate 319 as shown in FIG. 7. The conductor plate 315 and conductor plate 318 are in other words placed in opposite facing laminated layers roughly in parallel by way of the IGBT 328 and the diode 156. The conductor plate 320 and conductor plate 319 are placed in the same way in opposite facing laminated layers roughly in parallel by way of the IGBT 330 and diode 166. Also, the conductor plate 320 and conductor plate 318 are coupled by way of the intermediate electrode 320 (See FIG. 8). The upper arm circuit and the lower arm circuit are electrically coupled by this coupling, and form the upper and lower arm series circuit.

As described above, the conductor plate 315 and conductor plate 318 enclose the IGBT 328 and the diode 156; and the conductor plate 320 and conductor plate 319 enclose the IGBT 330 and the diode 166; and the conductor plate 320 and conductor plate 318 are coupled by way of the intermediate electrode 329. After then coupling the control electrode 328A of IGBT 328 and the element side signal connector terminal 327U by the bonding wire 371, the control electrode 330A of the IGBT 330 and the element side signal connector terminal 327L are coupled by the bonding wire 371 (See FIG. 6).

The section including the power semiconductor element and bonding wire 371 assembled in this state are sealed by the first sealing resin 348 (See FIG. 5). This section is retained in a metal mold from above and below, and the first sealing resin 348 is filled into the metal mold by the transfer mold.

After sealing by the first sealing resin 348, the tie bar 372 shown in FIG. 7 is removed, and the element side DC positive connector terminal 315D, the element side AC connector terminal 320D, the element side signal connector terminal 327U, and the element side signal connector terminal 327L are respectively separated. Each terminal section on the element side DC positive connector terminal 315D, the element side DC negative connector terminal 319D, the element side AC connector terminal 320D, and the element side signal connector terminal 327U, 327L arrayed in a row on one side is bent in the same direction. This processing improves the productivity by making the task of metal bonding of the module primary sealing piece 302 and the auxiliary mold piece 600 easier as shown in FIG. 5, and also improves the reliability of the metal bond (or junction).

Figure 9:
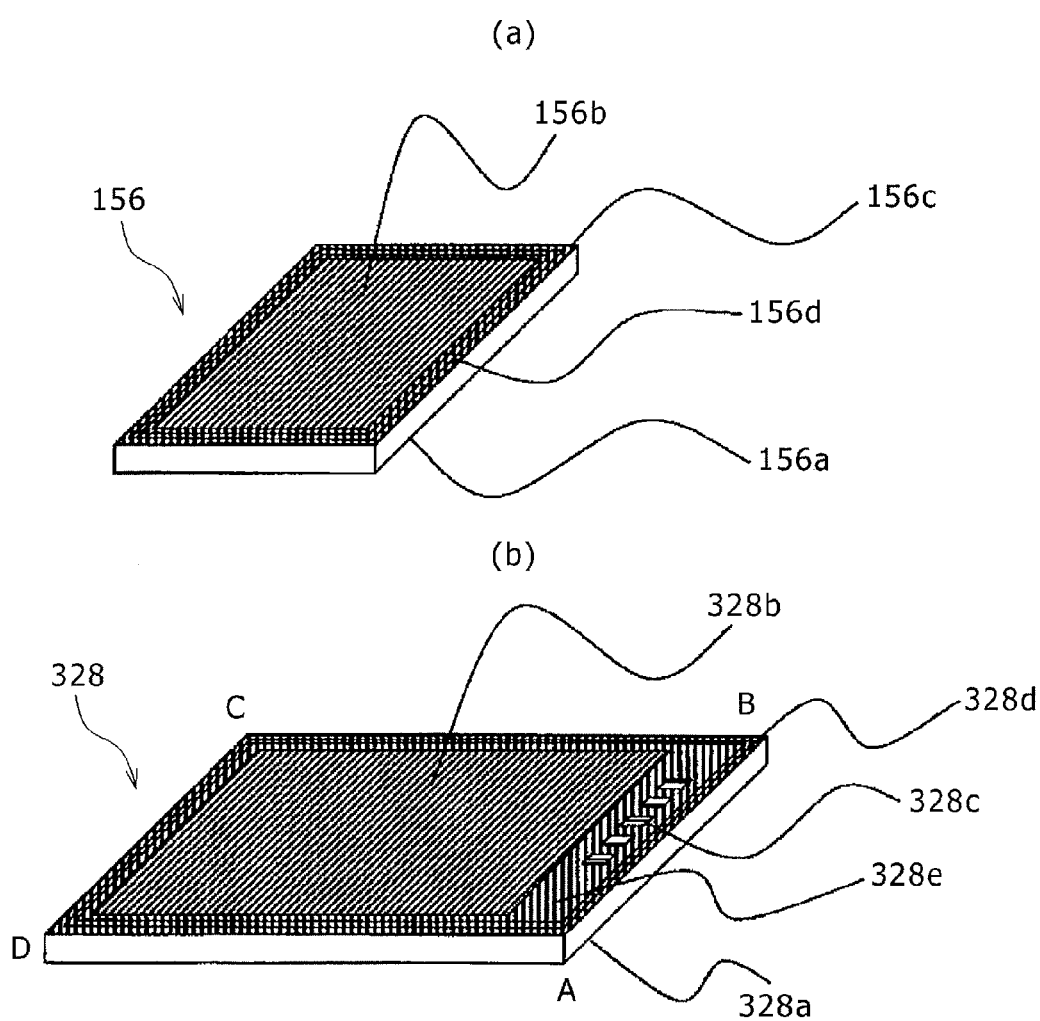
FIG. 9(a) is a perspective view of the diode 156.
FIG. 9(b) is a perspective view of the IGBT32.

FIG. 9(a) is a perspective view of the diode 156. FIG. 9(b) is a perspective view of the IGBT 328. Diode chips such as the freewheel diode (FWD) include different main electrodes over the front surface and rear (backside) of the chip as shown in FIG. 9(a). A cathode electrode 156a with a surface area roughly equivalent to the chip main surface is formed over the backside of the diode 156. An anode electrode 156b on other hand with a surface area smaller than the cathode electrode 156a is formed in the front side of the diode 156. A guard ring 156c is formed in the external circumferential section on the front side of the diode 156. A passivation film 156d is formed with polyimide (PI) as a base, in the total area margin of the outer circumferential section of the anode electrode 156b; and maintains a withstand voltage among the main electrodes over the diode 156 front and rear surfaces.

The IGBT 328 on the other hand includes different main electrodes over the chip front and rear surfaces, and further contains plural control electrodes over the front surface side as shown in FIG. 9b. A collector electrode 328a serving as the main electrode is formed over the rear surface side of the IGBT 328. The emitter electrode 328b is formed as the main electrode over the front surface side of the IGBT 328. The gate electrode 328c serving as the control electrode is formed over the front surface side of the IGBT 328. A guard ring 328 is formed on the outer circumferential section of the front surface side of the IGBT 328. A passivation film 328e having a polyimide (PI) as a base is formed over the total area margin of the outer circumferential section of the gate electrode 328c and the outer circumferential section of the emitter electrode 328b over the front surface side of the IGBT 328, and maintains a withstand voltage between the collector electrode 328a, the emitter electrode 328b, and the gate electrode 328c.

Figure 10:
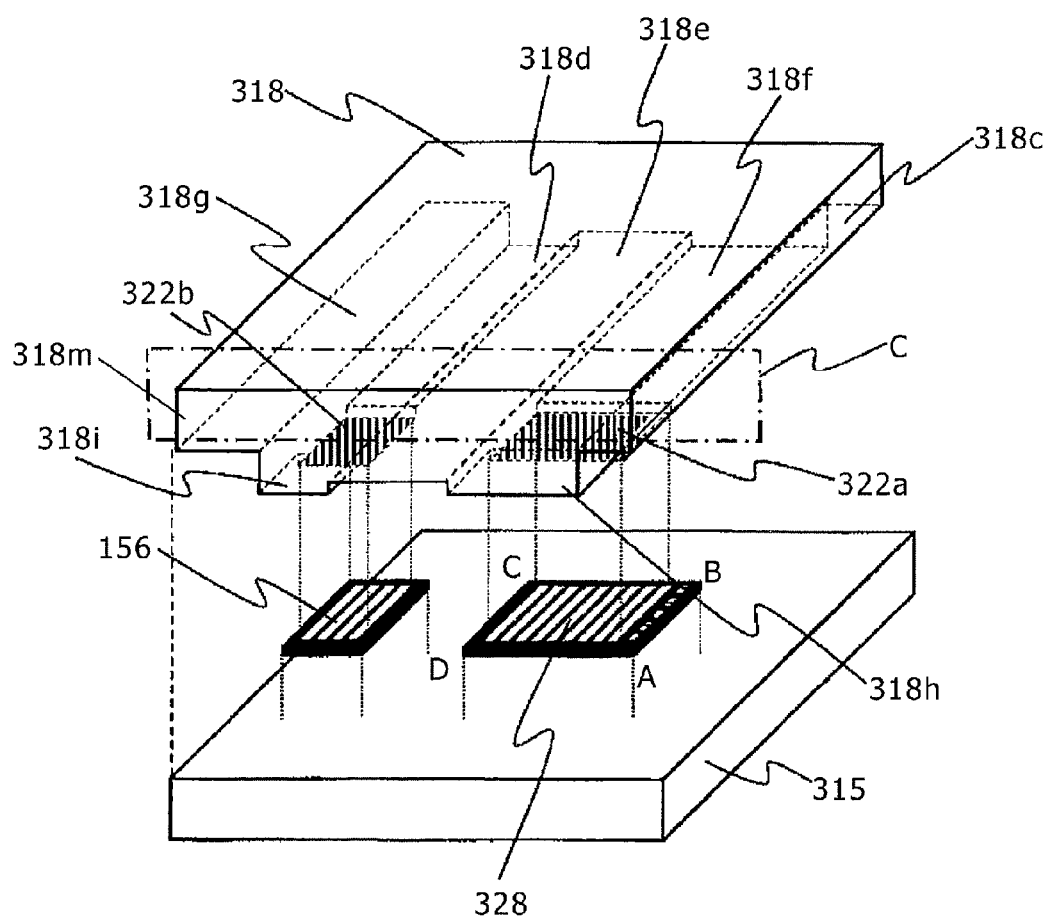
FIG. 10 is an enlarged exploded perspective view of the vicinity of the IGBT328 and the diode 156 for the module primary sealing piece 302 shown in FIG. 7.
Figure 11:
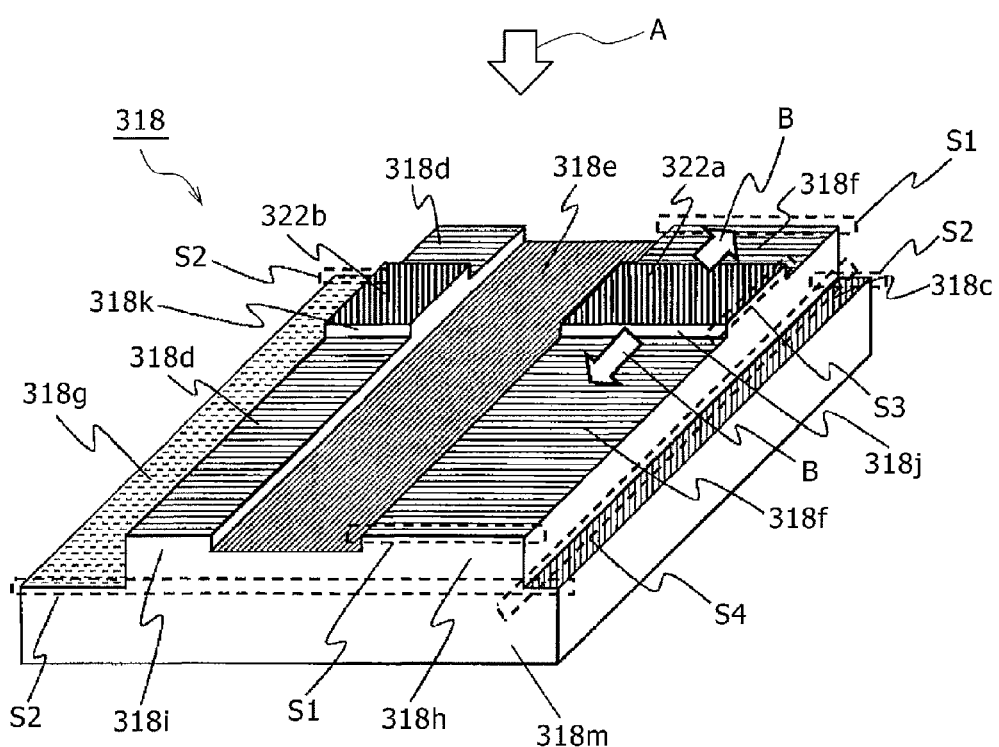
FIG. 11 is a perspective view of the conductor plate 381 shown in FIG. 10 with the upper and lower sections inverted.
Figure 12:
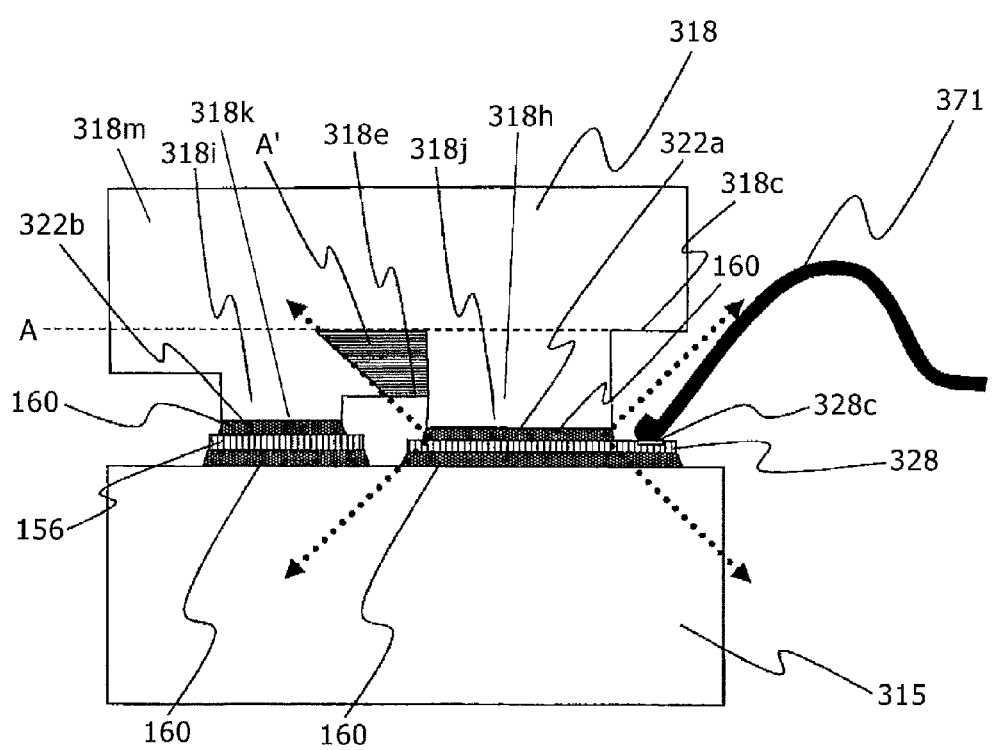
FIG. 12 is a cross sectional view as seen from the C cross sectional direction shown in FIG. 10.
Figure 13:
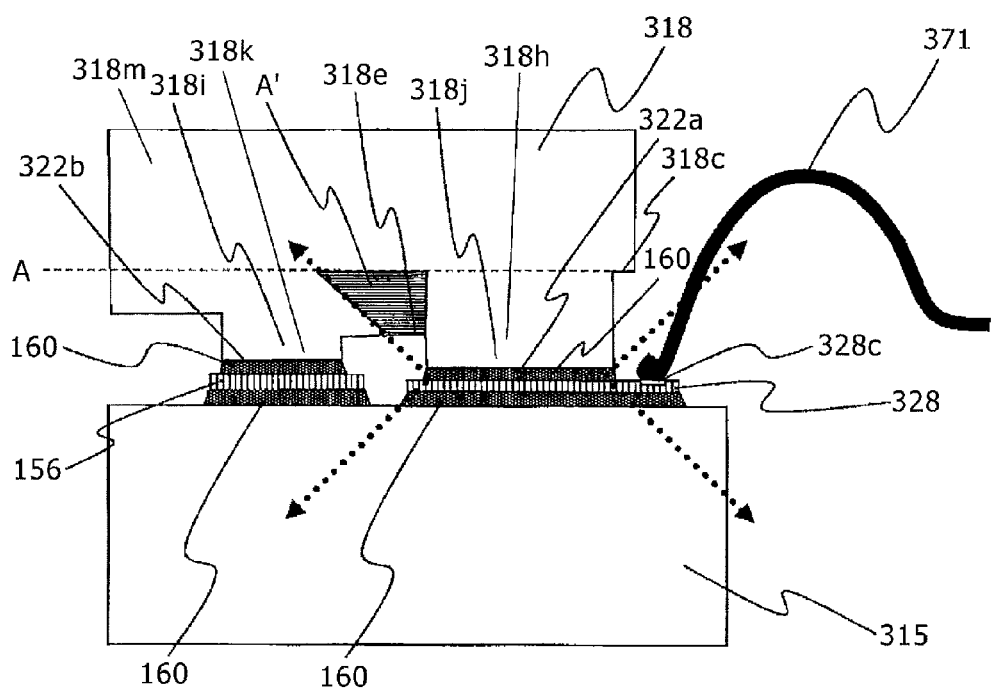
FIG. 13 is an alternative plan for FIG. 12, and is a cross sectional view as seen from the C cross sectional direction shown in FIG. 10.

FIG. 10 is an enlarged exploded perspective view of the vicinity of the IGBT 328 and the diode 156 for the module primary sealing piece 302 shown in FIG. 7. FIG. 11 is a perspective view of the conductor plate 318 shown in FIG. 10 with the upper and lower sections inverted. FIG. 12 is a cross sectional view as seen from the direction of the C cross section shown in FIG. 10. FIG. 13 is an alternative plan for FIG. 12, and is a cross sectional view as seen from the direction of the C cross section shown in FIG. 10.

A first protrusion section 318h is formed on the side where the IGBT 328 of conductor plate 318 is placed and protruding from the base section 318m of the conductor plate 318 towards the applicable IGBT 328 as shown in FIG. 10 and FIG. 11. A first protrusion section 318i is formed in the same way on the side where the diode 156 of conductor plate 318 is placed, protruding from the base section 318m of the conductor plate 318, towards the applicable diode 156.

A first protrusion surface 318f is formed over the upper side of the first protrusion section 318h. If there is an projection from the direction of the arrow A in FIG. 11, then the first protrusion section 318h is formed so that the projecting section of the side S1 over the first protrusion surface 318f overlaps the projecting section of the side S2 over the conductor plate 318. The first protrusion section 318i on the diode 156 side has the same structure and the first protrusion surface 318d is formed over the upper side of the first protrusion section 318i.

A second protrusion section 318*j* is formed to protrude towards the IGBT328 over the first protrusion surface 318*f* as shown in FIG. 11. A second protrusion section 318*k* is formed to protrude towards the diode 156 over the first protrusion surface 381*d*.

A second protrusion surface 322*a* is formed opposite the emitter electrode 328*b* of the IGBT328, over the upper surface of the second protrusion section 318*j* as shown in FIG. 11. When there is an projection from the direction of arrow A in FIG. 11, the second protrusion section 318*j* is formed so that the projecting section of side S3 over the second protrusion surface 322*a* overlaps the projecting section of step section S4 formed between the base section 318*m* and first protrusion section 381*h* of the conductor plate 318. The second protrusion section 318*k* on the diode 156 side also has the same structure, and a second protrusion surface 322*b* is formed opposite the anode electrode 156*b* of diode 156 over the upper surface of the second protrusion surface 318*k*.

A conductor plate surface 318*c* is formed between one side of the base section 318*m* of conductor plate 318 and the first protrusion section 318*h*. A conductor plate surface 318*e* is formed between the first protrusion section 318*i* and the first protrusion section 318*h*. A conductor plate surface 318*g* is formed between the first protrusion section 318*i* and the other side of the base section 318*m* of conductor plate 318.

The second protrusion surface 322*a* is bonded by way of the metal junction 160 to the emitter electrode 328*b* of the IGBT328 as shown in FIG. 12. The second protrusion surface 322*b* is bonded by way of the metal junction 160 to the anode electrode 156*b* of diode 156. Here, the IGBT328 is positioned so that the plural gate electrodes 328*c* do not to face opposite the second protrusion surface 322*a* and also positioned along the side S3 of the second protrusion surface 322*a*. The plural gate electrodes 328*c* are positioned facing opposite the conductor plate surface 318*c* serving as the surface of the base section 318*m* of the conductor plate 318. The metal junction 160 is positioned between the emitter electrode 328*b* and second protrusion surface 322*a* so as to avoid placement in the periphery of the gate electrode 328*c*. The metal junction 160 is in other words interposed between the emitter electrode 328*b* and second protrusion surface 322*a* so as to avoid the gate electrode 328*c*. The metal junction 160 is comprised of solder material, etc.

There is no passivation film formed over the gate electrode 328*c* of IGBT328. The applicable gate electrode 328*c* is electrically coupled to the element side signal connector terminal 327U (See FIG. 6) by the metal wire 371 as shown in FIG. 12. Members that must be kept insulated from this wire 371 are the metal junction 160, and the conductor plate surface 318*c* and second protrusion section 318*j* of the conductor plate 318. Whereupon in the present invention, the distance between the side S3 of second protrusion surface 322*a* and the conductor plate surface 318*c*, is larger than the distance between the other side of second protrusion surface 322*a* and the first protrusion surface 318*f*, and the distance between the other sides of second protrusion surface 322*a* and the conductor plate surface 318*e*. Utilizing this structure can prevent a drop in the withstand voltage for the wire 371 and the gate electrode 328*c* of IGBT328. Moreover, the above structure can efficiently convey the heat conveyed from the IGBT328 within the conductor plate 318 so that the heat dissipation efficiency of the IGBT328 is greatly improved.

In other words, the first protrusion surface 318*f* is formed at a distance nearest to the high direction of the second protrusion surface 322*a*, and next the conductor plate surface 318*e* is formed at a distance near to the high direction of the second protrusion surface 322*a* as shown in FIG. 11. The surface formed farthest to the high direction of the second protrusion surface 322*a* is the conductor plate front surface 318*c*. This arrangement drastically accelerates the conduction of heat in the heat propagation direction B shown in FIG. 11. The diffusion path when heat from the IGBT328 is widening at a 45 degree angle is shown by the dotted arrow in FIG. 12. The conductor plate front surface 318*e* is formed closer to the first protrusion surface 318*f* than the conductor plate surface 318*c* so that the propagation path widens by a portion just equal to the area A'. The heat dissipation can therefore be drastically improved and a drop in the withstand voltage can also be prevented.

The present embodiment can therefore attain a heat propagation path for conveying the heat of the IGBT328 as the power semiconductor element between the first protrusion section 381*h* and the second protrusion section 318*j*. A heat propagation path can further be attained in the same way to convey the heat of the diode 156 as the power conductor element between the first protrusion section 318*i* and the second protrusion section 318*k*. Further, the present embodiment can also attain an ample insulation distance between the surface of the first conductor plate 318 and the gate electrode 328*c* serving as the control electrode for the IGBT328.

In terms of increasing the productivity, a drawing process is also preferably performed on the metal member in the case where manufacturing a conductor plate 318 as shown in FIG. 11 as described above. In this way, along with preventing a drop in the withstand voltage, the heat dissipation efficiency can also be vastly improved and moreover the conductor plate 318 production productivity can also be improved.

FIG. 13 is a cross sectional view showing the conductor plate 318 of another embodiment. The conductor plate 318 is preferably formed with a small surface area so that the conductor plate surface 381*c* does not face opposite the gate electrode 328*c* of the IGBT328. This arrangement is needed in order to attain space for inserting the jig for mounting the wire 371 and space for placement of the wire 371.

The conductor plate 318 described in FIG. 10 through FIG. 13 is formed in a plurality of steps by the first protrusion surface 318*f* and conductor plate surface 318*c* and conductor plate surface 381*e* so that the first sealing resin 348 shown in FIG. 3(*b*) is firmly attached to the conductor plate 318. Cracks occurring during temperature cycle process at environmental temperatures from −45° C. to 125° C. at which automobiles are used might cause a drop in the reliability of the power converter due to strain (deformation) on the metal junction 160. However in the present embodiment, the first sealing resin 348 that protects the conductor plate 318, the metal junction 160, and the IGBT328 is strongly attached to the conductor plate 318 so that deformation (strain) on the metal junction 160 and the IGBT328 can consequently be suppressed, and therefore the power converter reliability is improved.

Figure 14:
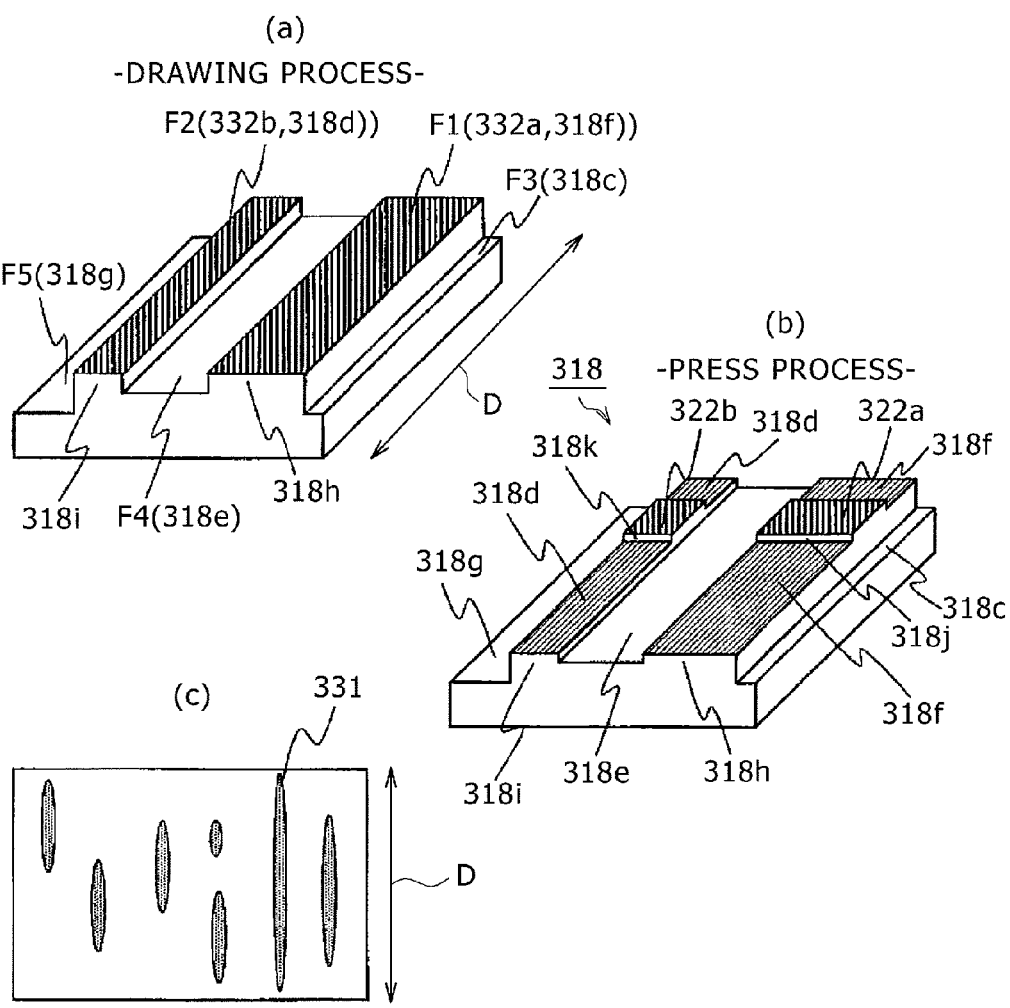
FIG. 14 is a drawing for describing the manufacturing process for the conductor plate 318 shown in FIG. 10 through FIG. 13.

FIG. 14 is a drawing for describing the manufacturing process for the conductor plate 318 described in FIG. 10 through FIG. 13.

FIG. 14(*a*) is a drawing showing the plate material fabricated by the drawing method. The drawing plane F1 is a surface formed by the second protrusion surface 322*a* and first protrusion surface 318*f* in a subsequent process. The drawing plane F2 is a surface formed by the second protrusion surface 322*b* and first protrusion surface 318*d* in a subsequent process. The drawing plane F3 is a surface formed by the conductor plate surface 318*c* in a subsequent process. The drawing plane F4 is a surface formed by the conductor plate surface 318e in a subsequent process. The drawing plane F5 is a surface formed by the conductor plate surface 318g in a subsequent process.

The accuracy of the thickness for the drawing planes F1 through F5 can be enhanced to a high level compared to other fabrication methods such as rolling, by forming the conductor plate surface in steps by the drawing method of FIG. 14(a). The width of the drawing planes F1 and F2 can be individually changed when the width and length of the surface main electrodes on the IGBT328 and diode 156 are mutually different from each other. Moreover, even when the thickness of the IGBT328 and diode 156 are mutually different from each other, that difference can be separately adjusted by (changing) the thickness of the first protrusion section 318h and 318i with no loss in productivity and moreover can be adjusted to a high level of accuracy.

FIG. 14(b) is a drawing showing the conductor plate 318 after applying the press process to the plate material fabricated by the drawing method of FIG. 14(a). The drawing planes F1 and F2 are flattened by applying pressure to the sections corresponding to the first protrusion surfaces 318f and 318d by way of press processing so as to leave the sections corresponding to the second protrusion surfaces 322a and 322b still remaining. The press-processed surface area of each section can in this way be changed even if the width and length of the IGBT328 and diode 156 surface main electrodes are different, so that adjustment to a high level of accuracy is possible and there is no loss of productivity.

By fabricating, the protrusion section by way of a separate process in this way after having made the flat plate material, a conductor plate having excellent productivity and placement accuracy along the surface and accuracy along the thickness can be achieved compared to fabricating the protrusion section by trimming the flat sheet material and stripping by etching.

Processing such as roughening by chemical etching of the conductor plate 318, sandblast processing, anodizing, forming irregularities by press processing, or surface covering processing (e.g. a coating of material having polyimide as a base) and so on is preferably performed in order to achieve sealing between the conductor plate 318 and the first sealing resin 348 (See FIG. 3). The applicable processing can render the effect of a 2 to 3 fold or higher improvement in sealing strength (shearing strength, peel strength) of the conductor plate surface and resin.

The timing to perform the above roughening processing is preferably after the drawing process shown in FIG. 14(a) and before the press processing shown in FIG. 14(b). The productivity can in this way be drastically improved by performing processing such as roughening processing simply and at one time along the drawing direction D in FIG. 14(a).

The sealing between the conductor plate 318 and the first sealing resin 348 (See FIG. 3) can be even further enhanced by simultaneously performing irregularity (roughening) processing during the press processing to the first protrusion surfaces 318f, 318d that is equivalent to the pressed surfaces in FIG. 14(b).

FIG. 14(c) is an enlarged concept view of the drawing plane F1 of FIG. 14(a) obtained by electron microscopy.

An indentation 331 with a width of 2 µm and length of 10 to several hundred µm along the drawing direction D was found. The wetting spread direction of solder material having an Sn base of Sn—Ag alloy and Sn—Cu alloy was investigated. Results were that the wetting spread of the solder was small in the perpendicular direction relative to the indentation 331 forming direction. Namely, it was found that solder wetting spread does not tend to occur in directions perpendicular to the drawing direction D, and solder overflow and leakage from the second protrusion surface 322a does not tend to occur. Taking advantage of this phenomenon, the drawing direction D of the conductor plate 318 was set along the same direction as the side (side S3 in FIG. 11) along the direction that the gate electrode 328c of IGBT328 is arrayed. The solder overflow and leakage from the second protrusion surface 322a to the gate electrode 328c side can in this way be prevented, and the product yield rate can also be improved.

Also, joining a conductor plate 318 and power semiconductor element, by applying a nickel (Ni) plating (electroplating, non-electroplating, sputtered film) in a thickness of 1 µm or more on the surface of the conductor plate 318 having copper (Cu) or aluminum (Al) as a base, and utilizing Sn base solder having a content of Cu at 3-7 percent by mass, generates a layer having a $Cu_6Sn_5$ base, at the bonded interface between the solder and the nickel (Ni) plating.

This $Cu_6Sn_5$ layer functions as a barrier layer to suppress the reciprocal diffusion between the tin (Sn) and nickel (Ni) occurring due to a rise in temperature under the usage conditions. This barrier prevents consumption of the nickel plating, and maintains a bond having a high degree of reliability in the early stage coupling state so that the reliability of the power module is enhanced.

However, when a direct bond is made by tin (Sn)-based solder to copper (conductor plate), a $Cu_6Sn_5$ layer is formed at the bonded interface between the Sn (solder) and Cu (conductor plate) at the early stage of the coupling. However, when the bonding temperature and bonding hold time becomes long, a brittle $Cu_3Sn$ layer is generated at the interface between the above described $Cu_6Sn_5$ layer and Cu (conductor plate).

Results from measuring the shearing strength and tensile strength showed that a drop in strength occurred due to the forming of the $Cu_3Sn$ layer. Moreover, when a thermal cycle test was made at −45° C. to 125° C. (maintained for 30 minutes at each temperature) in consideration of the usage environment at this state, the growth occurred in the $Cu_3Sn$ layer, and a drop in strength occurred as the number of thermal cycles increases.

When nickel plating is coated on the surface of the conductor plate, and the metal junction is comprised of Sn-3 to 7Cu solder in this way, maintaining the initial sturdy bonding state is easily accomplished and a high reliability power module can be provided compared to when making a direct bond with Sn-based solder on Cu (conductor plate).

Also, a manufacturing method for a power module capable of a low void rate is described for the case where a bond was made between the conductor plate 318 and the power semiconductor element by applying copper (Cu) plating or nickel (Ni) plating to a conductor plate 318 surface having aluminum as a base, and utilizing Sn-based solder.

In recent years, in view of the need for environmental conservation, there are increasing demands for electrical products that use solder which does not contain lead (Pb). In cases in particular where using Sn-based solder, the melting start temperature drops to a temperature lower than the Pb-based solder melting start temperature in the vicinity of 300° C., and may for example fall to the vicinity of 200° C. Along with this drop, even if the bonding atmosphere is for example a deoxidized atmosphere due to flux or hydrogen and so on, then a natural oxidized film from the copper or nickel plated surface still remains during the start of melting of the Sn-based solder. Compared to internal particle deoxidizing of the oxidized film of copper or nickel, the deoxidizing in this case starts from the particle boundary so that the wetting spread of the tin (Sn) becomes uneven, gas becomes trapped inside, and the deoxidizing of the oxidized film of copper or nickel in the melted tin film causes the generated gas to be trapped so that an increase in the void rate can be observed compared to when utilizing Pb-based solder.

Notice was taken of the fact that deoxidizing of the oxidized film present on the bond surface occurs before the solder melting starts, and silver (Ag) plating was further deposited above the copper or nickel plating of the conductor protrusion surface. Results from adding silver (Ag) plating showed that even in any atmosphere such as deoxidized atmosphere (hydrogen, etc.) or an inert atmosphere (nitrogen, etc.); the oxidized film was deoxidized prior to the start of melting of the Sn-based solder, the trapping of gas cause by uneven wetting spread and trapping of gas that accompanies deoxidizing of the oxidized film after melting were suppressed, and that the number of voids present after the bond were reduced 20 percent compared to the case where no silver (Ag) plating was performed. The same effect as silver (Ag) plating was also obtained when gold (Au) plating was applied. Therefore, applying the gold or silver plating above the copper or nickel plating in this way can decrease the void rate in the bond even further, and improves the heat dissipation and service life of the power module. Also, forming a gold (Au) plating or silver (Ag) plating above the nickel (Ni) plating and using Sn-3 to 7Cu solder allowed a bonded interface having a high withstand voltage at higher temperatures.

Figure 16:
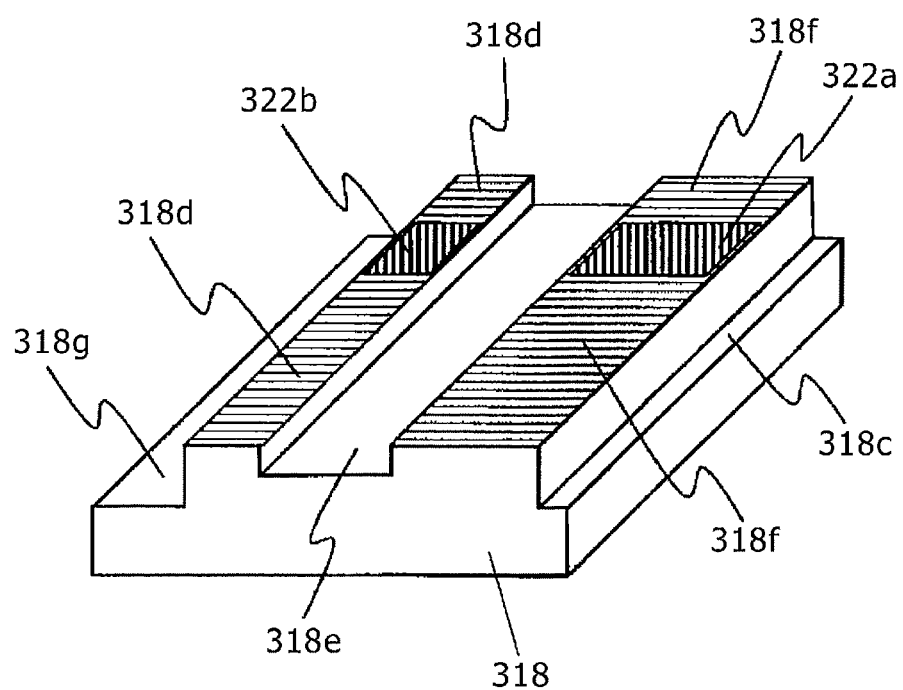
FIG. 16 is a drawing for describing another manufacturing process for the conductor plate 318.

The productivity was drastically improved by performing the above described plating process methods, and above described roughening process methods after the drawing process shown in FIG. 14(a) and before the press process shown in FIG. 14(b). As shown in FIG. 16, spot plating or masking of other than the applicable surface is implemented for the conductor plate 318, on sections corresponding to the second protrusion surface 322a and 322b where the IGBT328 and diode 156 are mounted, in order to plate the sections that correspond to the second protrusion surface 322a and 322b. After performing the above described roughening process, the press processing shown in FIG. 14(b) is next performed. The above described plating process and roughening process can in this way be processed at one time, with the conductor plate 318 in a drawn material state, so that a manufacturing method can be provided having productivity higher than in batch processing.

The selection of a roughening (coarsening) fluid to cause a reaction just on the surface of the conductor plate 318 in the event of roughening of the conductor plate after Ni (nickel) plating or roughening of the conductor plate after Ag plating, eliminates the necessity for masking of the plated surface so that a manufacturing method with even higher productivity is provided.

The plated surface may also be formed in stripe shape along the drawing direction D on the plated surface on the drawing planes F1 and F2 as shown in FIG. 14(a). Masking can in this way be performed more easily than masking in spot states. Moreover high-speed processing can be performed compared to spot plating. Roughening processing is next implemented on the other drawing planes F3 through F5 of the conductor plate 318. Selecting a roughening fluid when roughening processing is needed, allows eliminating the masking of the plated surfaces. During the press processing in FIG. 14(b) when fabricating the second protrusion surfaces 322a and 322b, there is still plating remaining on the first protrusion surfaces 318f and 318g. So when the solder overflows, the solder can in this way be allowed to escape in the plating direction (drawing direction D). This effect is especially large during Ag plating, and is not just the effect on indentations but also includes the added effect from the difference in metal types.

Figure 15:
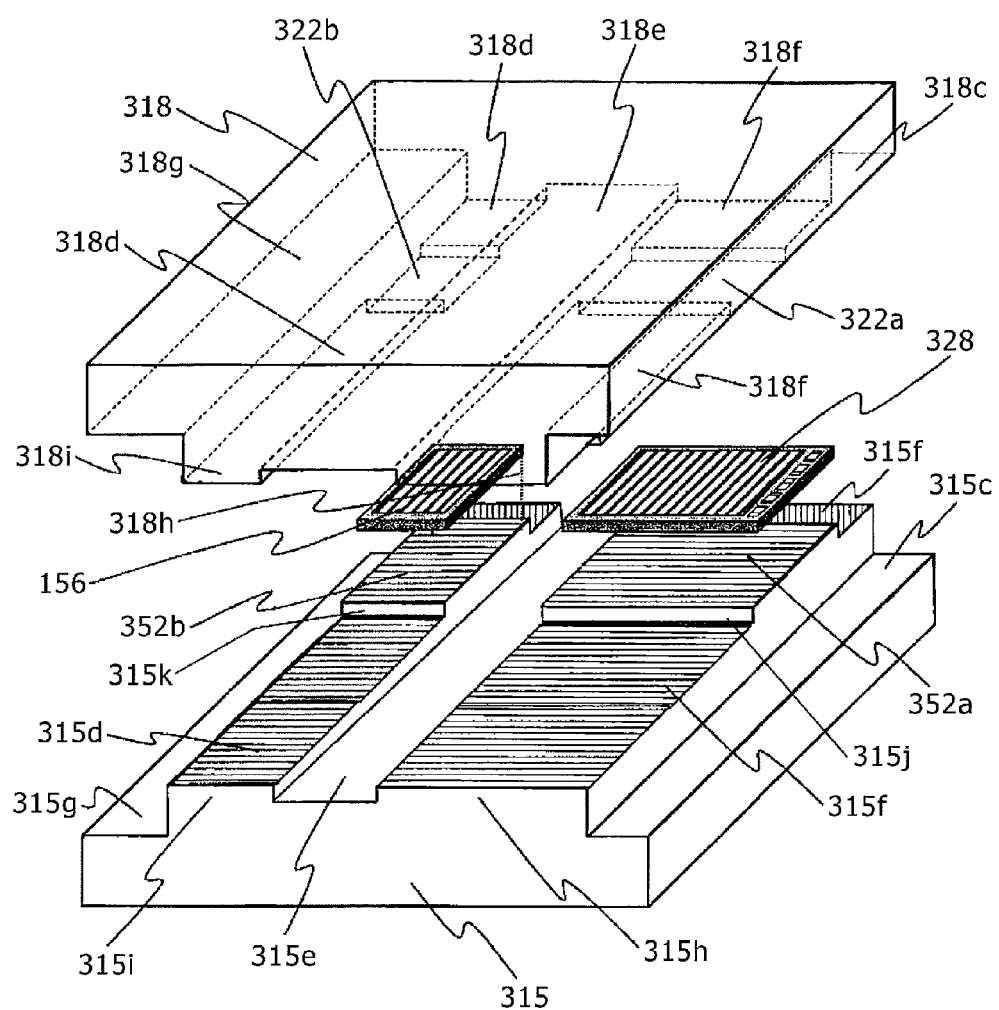
FIG. 15 is an exploded perspective view of the module primary sealing piece 302 of the second embodiment.

FIG. 15 is an exploded perspective view of the module primary sealing piece 302 of the second embodiment. The point differing from the first embodiment is that the conductor plate 315 is formed with the same protrusion sections and so on in the same process as for conductor plate 318. The first protrusion section 315h, first protrusion section 315i, second protrusion section 315j, second protrusion section 315k, second protrusion surface 352a, second protrusion surface 352b, first protrusion surface 315f, first protrusion surface 315d, conductor plate surface 315c, conductor plate surface 315e, and conductor plate surface 315g are respectively formed over the conductor plate 315.

The second protrusion surface 352a faces opposite a collector electrode 328a formed with no gate electrode 328c of the IGBT328c and so must be made larger than the second protrusion surface 322a. The width of the first protrusion section 315h must therefore be formed larger than the width of the first protrusion section 318h.

By utilizing the structure of the present embodiment, between the second protrusion surface 322a and second protrusion surface 352a, the IGBT328 is respectively bonded by way of the metal junction 160 to the second protrusion surface 322a and second protrusion surface 352a. Moreover, between the second protrusion surface 322b and second protrusion surface 352b, the diode 156 is respectively bonded by way of the metal junction 160 to the second protrusion surface 322b and second protrusion surface 352b. The conductor plates 315, 318, IGBT328, and diode 156 are sealed by resin and so warping and strain on the metal junction 160 is reduced by sealing the resin with the conductor plate 315 and conductor plate 318 in numerous steps. This structure also prevents a large loss in heat dissipation in the conductor plate 315.

The conductor plate 318 of the first embodiment and second embodiment was described for the case where there is one IGBT328 and diode 156 for each, however by forming two second protrusion sections 318j along the forming direction of the first projection section 318h; and also forming two second protrusion detection sections 318k along the forming direction of the first protrusion section 318i, two IGBT328 and two diode 156 can respectively be coupled to one conductor plate 318.

In the above embodiment, the step section S4 was the edge line (corner) serving as the boundary between the base section 318m and first protrusion section 318h (See FIG. 11) however the present invention is not limited to this arrangement. The edge line section may be utilized as the step section. A section including the entire conductor plate surface 381c of the base section 318m as well as the entire perpendicular surface of the first protrusion section 318h and the second protrusion section 318j may also be utilized. In the case where using a step section including entire perpendicular surface of the first protrusion section 318h and the second protrusion section 318j, then at least a portion of the perpendicular surface of the step section may overlap the side S3 of the second protrusion section 322a. The present invention may therefore also apply to the case where the boundary between base section 318m and the first protrusion section 318h is a curved section and not a corner.

The various embodiments and variations were described above however the present invention is not limited to the content of these embodiments and variations. Other configurations considered within the range of the technical concept of the present invention are also included within the scope of the present invention.

The disclosed contents of the following Japanese basic patent application for the priority right are incorporated herein by reference:
Japanese Patent Application No. 2010-220252 (application of Sep. 30, 2010)

The invention claimed is:

1. A power semiconductor module comprising:
a power semiconductor element containing a plurality of control electrodes on one main surface;
a first conductor plate bonded by way of a first solder material to other main surface of the power semiconductor element; and
a second conductor plate bonded by way of a second solder material to the other main surface of the power semiconductor element;
wherein a first protrusion section protruding from a base section of the first conductor plate and including a first protrusion surface formed over an upper surface of the first conductor plate,
a second protrusion section including a second protrusion surface facing towards one of the main surfaces of the power semiconductor element, formed over the first protrusion surface of the first conductor plate,
a first solder material interposed between the power semiconductor element and the first conductor plate, avoids the plural control electrodes, and a perpendicular projection from one of the main surfaces of the power semiconductor element,
the second protrusion section being formed so that a projecting section on a specified side of the second protrusion surface overlaps a projecting section on a step section formed between the first protrusion section and the base section of the first conductor plate, and
the plural control electrodes on the power semiconductor element being formed along the specified side of the second protrusion surface.

2. The power semiconductor module according to claim 1, wherein the power semiconductor element is positioned so that the control electrodes of the power semiconductor element face opposite the surface of the base section of the first conductor plate where no first protrusion section is formed; and further are formed arrayed along the specified side of the second protrusion section.

3. The power semiconductor module according to claim 2, wherein the surface of the base section of the first conductor plate having no first protrusion section, is further away from the second protrusion surface than the first protrusion surface.

* * * * *